United States Patent
Nakanishi et al.

(10) Patent No.: US 7,138,893 B2
(45) Date of Patent: Nov. 21, 2006

(54) MICRO DEVICE

(75) Inventors: Yoshito Nakanishi, Machida (JP); Yoshito Shimizu, Kawasaki (JP); Hiroyuki Yabuki, Kawasaki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 117 days.

(21) Appl. No.: 10/478,305

(22) PCT Filed: Jan. 16, 2003

(86) PCT No.: PCT/JP03/00317

§ 371 (c)(1),
(2), (4) Date: Dec. 3, 2003

(87) PCT Pub. No.: WO03/059805

PCT Pub. Date: Jul. 24, 2003

(65) Prior Publication Data

US 2004/0149558 A1 Aug. 5, 2004

(30) Foreign Application Priority Data

Jan. 16, 2002 (JP) .............................. 2002-006908
Dec. 16, 2002 (JP) .............................. 2002-364322

(51) Int. Cl.
*H01H 51/22* (2006.01)
(52) U.S. Cl. ........................................ 335/78; 200/181
(58) Field of Classification Search ................. 335/78; 200/181
See application file for complete search history.

(56) References Cited

U.S. PATENT DOCUMENTS

| | | | |
|---|---|---|---|
| 4,901,586 A * | 2/1990 | Blake et al. ............. | 73/862.59 |
| 5,149,673 A | 9/1992 | MacDonald et al. | |
| 6,034,339 A | 3/2000 | Pinholt et al. | |
| 6,127,767 A * | 10/2000 | Lee et al. ............. | 310/309 |
| 6,191,671 B1 * | 2/2001 | Schlaak et al. ........... | 335/78 |
| 6,218,911 B1 | 4/2001 | Kong et al. | |
| 6,236,281 B1 * | 5/2001 | Nguyen et al. ............. | 331/154 |
| 6,509,670 B1 * | 1/2003 | Jeong et al. ............. | 310/309 |
| 6,534,899 B1 * | 3/2003 | Takeuchi et al. ........ | 310/323.17 |
| 6,621,390 B1 * | 9/2003 | Song et al. ............. | 335/78 |
| 6,798,315 B1 * | 9/2004 | Schaefer ............. | 333/105 |

(Continued)

FOREIGN PATENT DOCUMENTS

FR  2706074   6/1993
JP  9-251834   9/1997

OTHER PUBLICATIONS

English Language Abstract JP9-251834.

(Continued)

*Primary Examiner*—Elvin Enad
*Assistant Examiner*—Bernard Rojas
(74) *Attorney, Agent, or Firm*—Greenblum & Bernstein, P.L.C.

(57) ABSTRACT

Resonators 4 and 5 are able to oscillate horizontally and vertically to substrate 1. Resonator 4 is primarily composed of a supporting portion in stationary contact with substrate 1, a movable portion including a contact surface making contact with resonator 5 and a contact surface making contact with electrode 7, and a crossing portion that couples the supporting portion and movable portion. Electrode 6 is disposed in the direction in which resonator 5 is spaced apart from resonator 4. Electrode 7 is disposed in the direction in which resonator 4 is spaced apart from resonator 5. Electrode 9 is disposed in a position that causes resonator 5 to generate electrostatic force in a direction different from the direction of both forces of attraction acting between resonators 4 and 5 and between resonator 5 and electrode 6.

6 Claims, 11 Drawing Sheets

U.S. PATENT DOCUMENTS 6,891,454 B1 * 5/2005 Naito et al. .................. 335/78
2002/0000364 A1 1/2002 Hong et al.

OTHER PUBLICATIONS

An article by R. J. Richards et al., entitled "MEMS for RF/Microwave Wireless Applications: The Next Wave," published in *Microwave Journal, Euro-Global Edition* vol. 44, No. 3, Mar. 2001, pp. 20, 24, 28, 32, 34, 38, and 41.

An article by S. Roy et al., entitled "Design, Fabrication, and Characterization of Electrostatic Microrelays," published in *Proceedings of the SPIE*, vol. 2642, pp. 64-73.

An article by D. Galayko et al., entitled "Design Methods for Micro-Electro-Mechanical Bandpass Filters," published in *Proceedings of the SPIE—the International Society for Optical Engineering*, vol. 4408, Apr. 2001, pp. 194-200.

*Introduction to Microelectromechanical Microwave Systems* published by Artech House Publishers, pp. 120-125.

* cited by examiner

OFF

MICRO DEVICE

TECHNICAL FIELD

The present invention relates to a micro device used in electric circuitry.

BACKGROUND ART

One of well-known conventional techniques is described in "Introduction to Microelectromechanical Microwave Systems", P122, Artech House Publishers.

Figure 1:
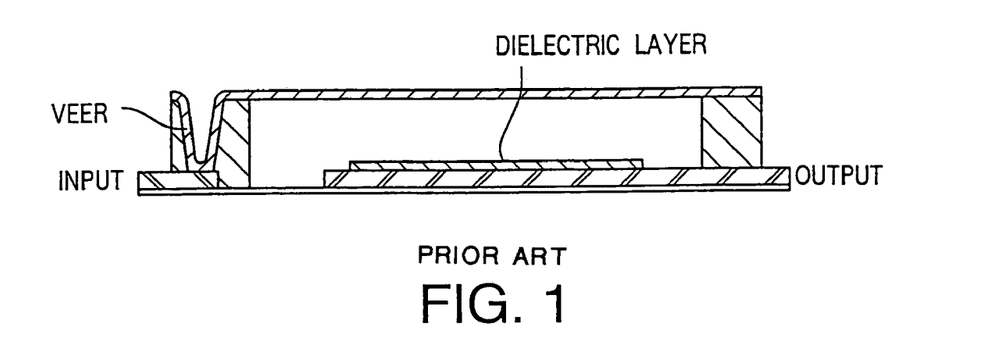
FIG. 1 is a cross-sectional view of a prior art switch having a membrane structure composed of membranes.
Figure 2:
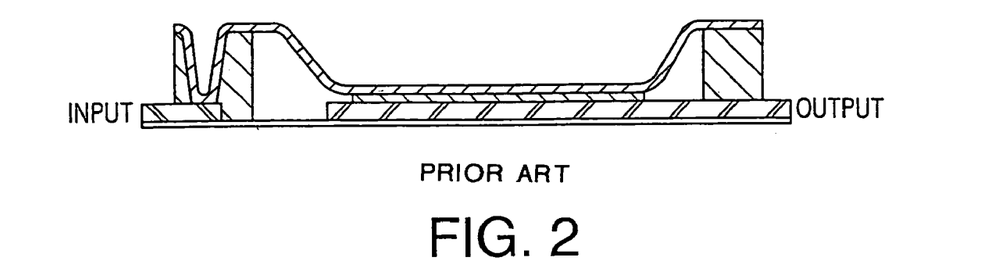
FIG. 2 is another cross-sectional view of the switch of FIG. 1 having the membrane structure composed of membranes.

The details will be described with reference to FIGS. 1 and 2. FIG. 1 is a cross-sectional view of a switch having a membrane structure composed of membranes. When breaking a signal, as shown in FIG. 2, static electricity is applied to bring a membrane into contact with an electrode, while being not applied in passing a signal.

However, in the conventional device, since a switch is short-circuited to attenuate signals, a reflected wave is generated on the short-circuited surface, whereby excessive power is sent back to an amplifier disposed before the switch and destroys the amplifier. Further, there is another problem that since a membrane and electrode are electrically coupled when not spaced adequately, a passage loss occurs when the switch is ON. Furthermore, when a distance between the membrane and electrode is large, required electrostatic force becomes too large, and an applied voltage becomes too high, resulting in another problem.

DISCLOSURE OF INVENTION

It is an object of the present invention to provide a micro device capable of securing higher isolation with a low voltage.

The object is achieved in a micro device by bringing into contact with or separating independently a plurality of resonators for feeding or interrupting electric signals with static electricity, thereby obtaining a distance twice that corresponding to an applied voltage and securing higher isolation with a low voltage.

BEST MODE FOR CARRYING OUT THE INVENTION

A micro device of the present invention has a plurality of fine-structure resonators that is brought into contact with one another by attraction due to static electricity, a plurality of first electrodes that generates attraction with the resonators due to static electricity to separate the resonators, and a first applying section that applies a voltage to the plurality of first electrodes, where a signal is passed through the resonators when the resonators are in contact with one another, while the signal passed through the resonators is interrupted when the resonators are separated.

According to this configuration, since each of the resonators is moved in the direction in which the resonators are spaced apart from one another, it is possible to obtain a distance twice that corresponding to an applied voltage, and to secure higher isolation with a low voltage.

In the micro device of the present invention, the resonators have conductive surfaces to be in contact with one another, and conduct a direct signal when being in contact with one another.

According to this configuration, the micro device functions as a switch for conducting direct signals.

In the micro device of the present invention, the resonators have insulating surfaces to be in contact with one another, and conduct an alternating signal when being in contact with one another.

According to this configuration, the micro device functions as a switch for conducting alternating signals.

In the micro device of the present invention, the first electrodes are connected to a ground or a power supply through resistance with characteristic impedance corresponding to a frequency of the alternating signal passed through the resonators.

According to this configuration, it is possible to prevent reflection of the signal in interrupting the signal.

The micro device of the present invention further has a second electrode that generates attraction with the resonators in directions except a direction in which attraction between the resonators is generated and a direction in which attraction between the resonators and the first electrodes is generated, and a second applying section that applies a direct signal between the second electrode and resonators.

According to this configuration, since it is possible to control the resonators to connect as a switch or to oscillate as a filer independently, the micro device has switching operation with filtering function.

The micro device of the present invention further has a same number of second electrodes as the number of the resonators, where the second electrodes are disposed in positions such that the direction between the resonators and the first electrodes is perpendicular to the direction between the resonators and the second electrodes, and the second applying section applies alternating signals with different frequencies for each of the second electrodes.

According to this configuration, it is possible to broaden a frequency band with which signals are passed through the filter.

The micro device of the present invention causes signals to be passed between the second electrodes and the resonators.

According to this configuration, it is possible to separate a signal for each frequency component.

The micro device of the present invention further has a sealing section that vacuum-seals the resonators.

According to this configuration, it is possible to switch between conduction and interruption of signal at high speed.

Embodiments of the present invention will be described below with reference to accompanying drawings.

(First Embodiment)

Figure 3:
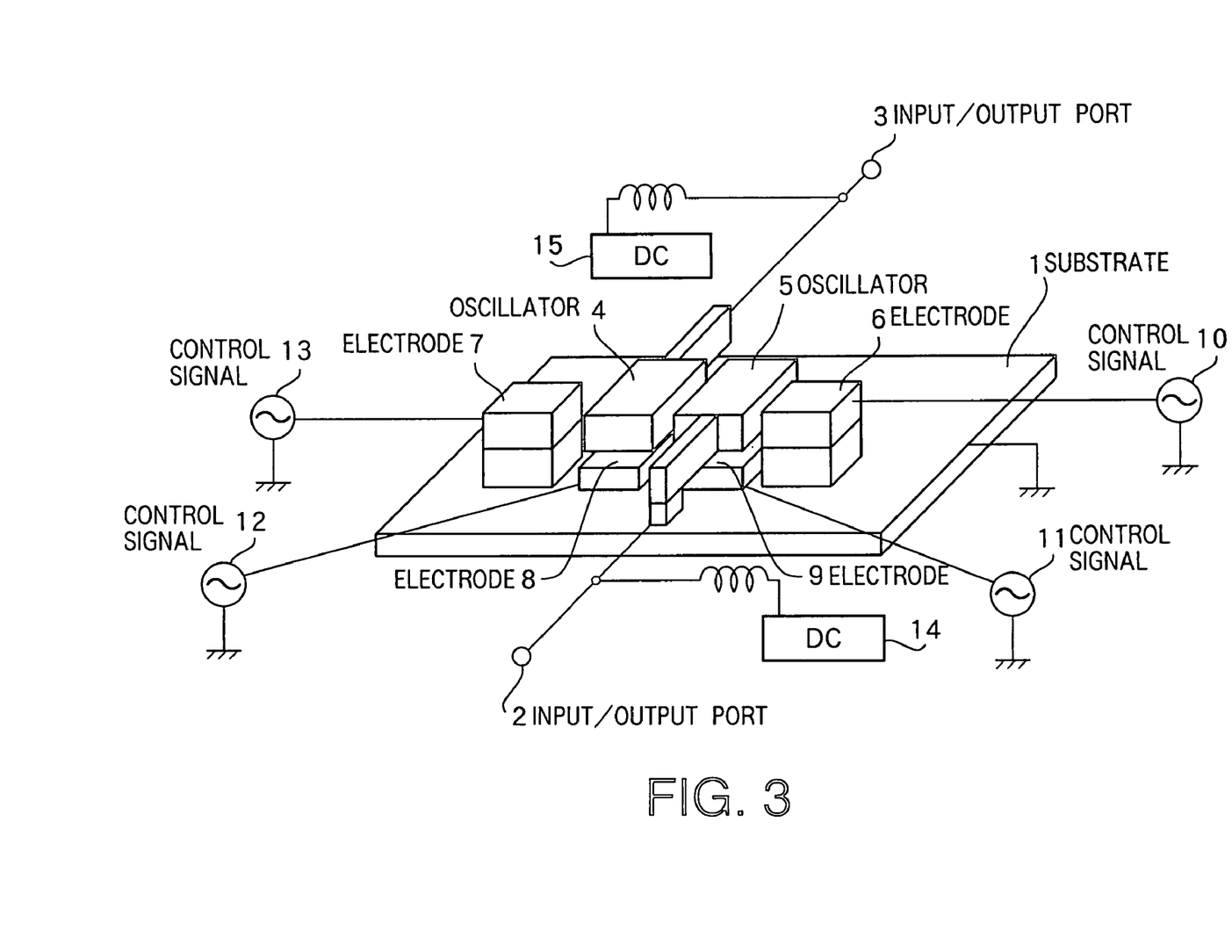
FIG. 3 is a diagram illustrating a configuration of a micro device according to a first embodiment of the present invention.

FIG. 3 is a diagram illustrating a configuration of a micro device according to the first embodiment of the present invention. The micro device in FIG. 3 is primarily composed of substrate 1, input/output ports 2 and 3, resonators 4 and 5, electrodes 6 to 9, and direct current sources 14 and 15, and each of "11" to "14" denotes a control signal. On substrate 1 are integrated resonators 4 and 5 and electrodes 6 to 9. Substrate 1 is preferably an insulator or semiconductor.

Input/output ports 2 and 3 are terminals for inputting/outputting a signal to/from a switch. Input/output port 2 is electrically connected to resonator 5. Similarly, input/output port 3 is electrically connected to resonator 4. The micro device enables signals to be passed from input/output port 2 to input/output port 3 through resonators 5 and 4. Further, signals may be passed from input/output port 3 to input/output port 2.

Resonators 4 and 5 are able to oscillate horizontally and vertically to substrate 1. Resonator 4 is primarily composed of a supporting portion in stationary contact with substrate 1, a movable portion including a contact surface making contact with resonator 5 and a contact surface making contact with electrode 7, and a crossing portion that couples the supporting portion and movable portion. For example, resonators 4 and 5 may be implemented by forming into a cantilever-beam structure. Direct potential is applied to resonators 4 and 5 through an inductor. Electrodes 6 to 9 are used to apply static electricity to the resonators.

Electrode 6 is preferably disposed in the direction in which resonator 5 is spaced apart from resonator 4. In other words, it is preferable that resonator 5 is present between resonator 4 and electrode 6, attraction acting between resonators 4 and 5 is present in the same axis of the attraction between resonator 5 and electrode 6, and that electrode 6 is disposed in the inverse side. Similarly to electrode 6, electrode 7 is preferably disposed in the direction in which resonator 4 is spaced apart from resonator 5.

Electrode 9 is disposed in a position that causes resonator 5 to generate the electrostatic force in a direction different from the direction of both forces of attraction acting between resonators 4 and 5 and between resonator 5 and electrode 6. For example, such a position is preferable that causes resonator 5 to generate the electrostatic force in the direction perpendicular to the direction of both forces of attraction acting between resonators 4 and 5 and between resonator 5 and electrode 6.

In other words, it is preferable that a surface of resonator 5 opposite to electrode 9 is in the direction perpendicular to contact surfaces between resonators 4 and 5 and between resonator 5 and electrode 6. Similarly, electrode 8 is disposed in a position that causes resonator 4 to generate the electrostatic force in a direction different from the direction of both forces of attraction acting between resonators 4 and 5 and between resonator 4 and electrode 7.

Control signal 10 is a signal for use in applying a voltage to electrode 6. Similarly, control signal 13 is a signal for use in applying a voltage to electrode 7. Control signal 11 is a signal for use in applying an alternating voltage to electrode 9. Similarly, control signal 12 is a signal for use in applying an alternating voltage to electrode 8.

DC electrode 14 applies a direct voltage to resonator 5. Similarly, DC electrode 15 applies a direct voltage to resonator 4.

Figure 4:
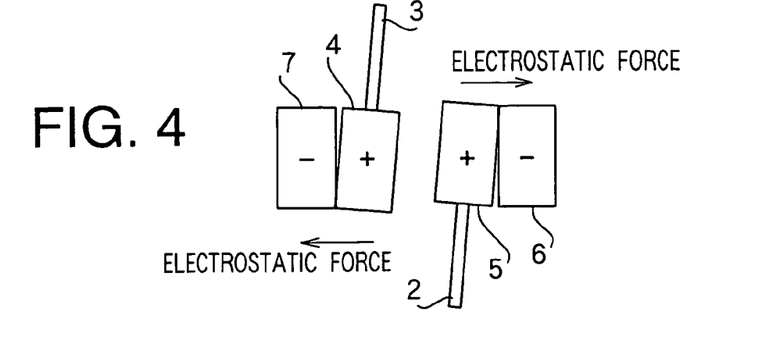
FIG. 4 is a diagram illustrating operation of the micro device according to the above embodiment.
Figure 5:
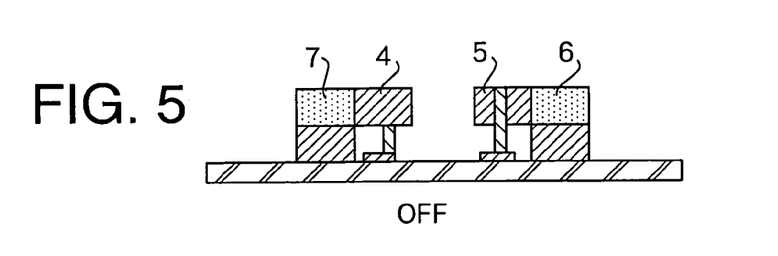
FIG. 5 is another diagram illustrating operation of the micro device according to the above embodiment.
Figure 6:
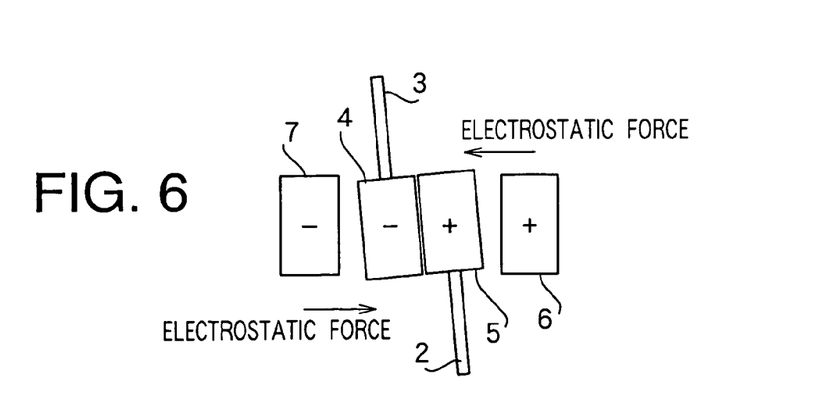
FIG. 6 is another diagram illustrating operation of the micro device according to the above embodiment.
Figure 7:
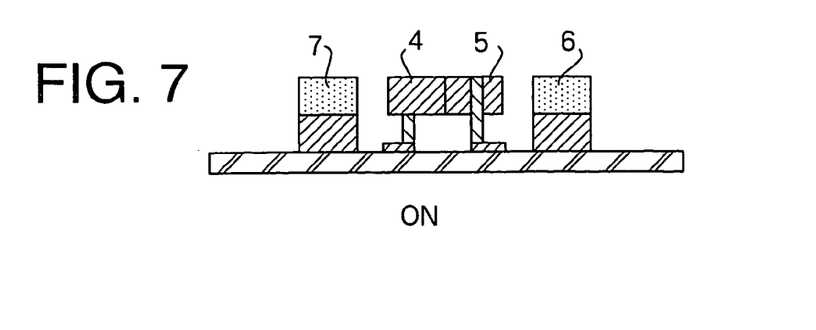
FIG. 7 is another diagram illustrating operation of the micro device according to the above embodiment.

A method of operating the switch will be described below. FIGS. 4 to 7 are diagrams illustrating the operation of the switch of this embodiment. FIG. 4 shows an upper view of the switch being OFF, FIG. 5 shows a cross-sectional view of the switch being OFF, FIG. 6 shows an upper view of the switch being ON, and FIG. 7 shows a cross-sectional view of the switch being ON. In making the switch OFF, for example, direct voltage Vc is applied to DC electrodes 14 and 15. When a voltage of −Vc is applied to electrodes 6 and 7, the electrostatic force is generated, resonator 4 is attracted towards electrode 7, resonator 5 is attracted towards electrode 6, and thus electrodes are electrically coupled to respective resonators. At this point, electrodes 6 and 7 have such resistance that corresponds to characteristic impedance when the switch is seen from the input/output terminals. When resonator 4 is brought into contact with electrode 6, any reflected wave is not generated due to the resistance. Further, since two resonators, 4 and 5, are moved to separate from each other, it is possible to obtain a distance twice that corresponding to the applied voltage, and to secure higher isolation.

When making the switch ON next, for example, −Vc is applied to DC electrode 14, +Vc is applied to DC electrode 15, +Vc is applied to electrode 6, and −Vc is applied to electrode 7. Resonators 4 and 5 are attracted to each other and electrically coupled.

At this point, when being physically in contact with each other, resonators 4 and 5 are capacity-coupled with dielectric films on the contact surface, while being resistance-coupled with no dielectric film on the contact surface. In the case of capacity coupling, the device functions as a switch with frequency characteristics. In the case of resistance coupling, a DC signal is passed from DC electrode 14 to DC electrode 15 and thus causes a short circuit, it is required to provide resistance as a substitute for an inductor or in series with the inductor.

Each of resonators 4 and 5 only requires in shape a size enabling their contact and separation by electrostatic force in a predetermined time. For example, resonators 4 and 5 are each in the shape of a cube with a length of 500 μm, thickness of 2 μm and width of 2 μm, and disposed such that a gap between resonators 4 and 5 is 0.6 μm, a gap between resonator 4 and electrode 7 is 0.6 μm, and a gap between resonator 5 and electrode 6 is 0.6 μm. When a thickness of the insulating material is 10 nm, applying 7v enables the resonators to respond in 5 μs or less. Further, a passage loss of SW is made 0.5 dB or less.

Figure 8:
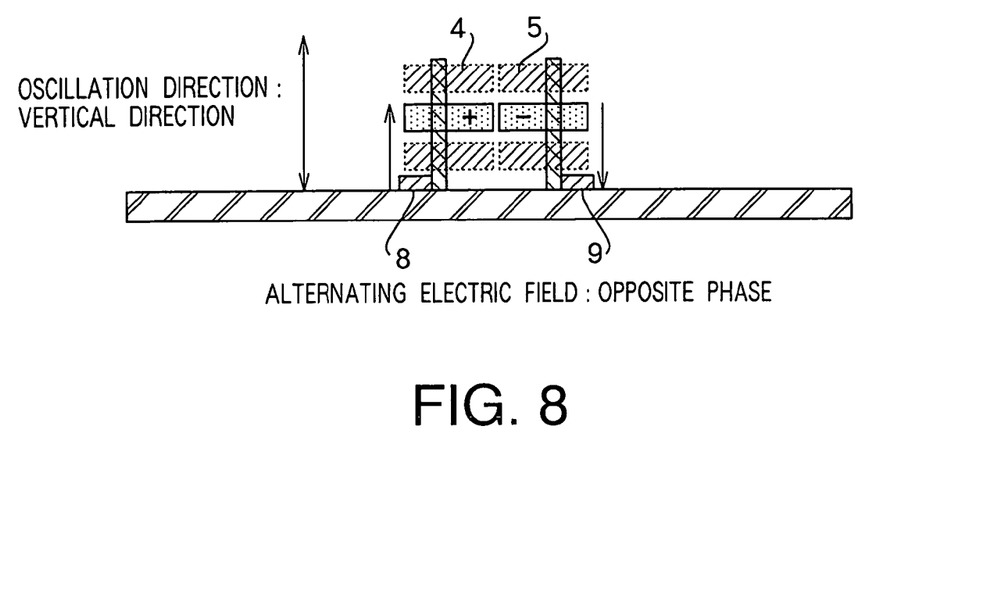
FIG. 8 is another diagram illustrating operation of the micro device according to the above embodiment.
Figure 9:
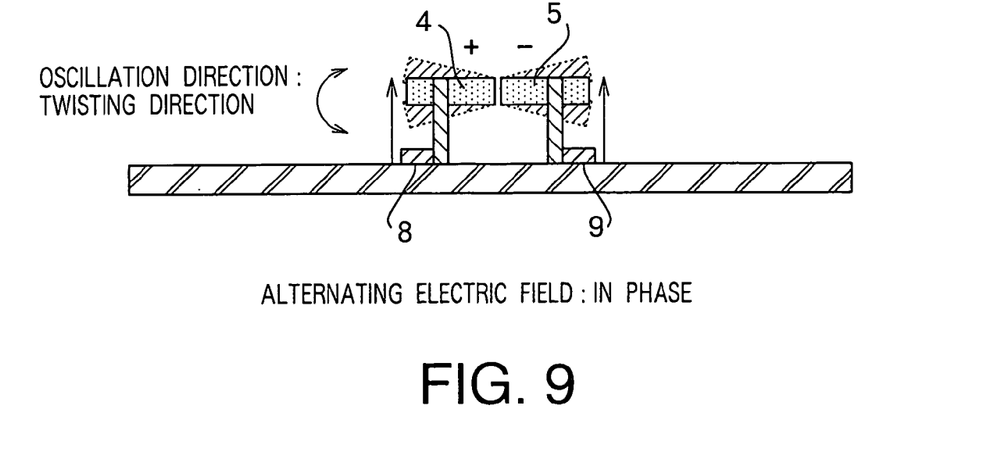
FIG. 9 is another diagram illustrating operation of the micro device according to the above embodiment.

The function as a filter will be described below. FIGS. 8 and 9 are diagrams illustrating the operation of the micro device of the present invention. As illustrated in FIG. 8, when resonators 4 and 5 are in contact with each other to make the switch ON and an alternating electric field with a desired frequency and amplitude is applied to resonators 4 and 5 respectively from electrodes 8 and 9, resonator 4 and 5 are driven and oscillate with a frequency corresponding to the control signal.

As a result, the capacity between resonator 4 and electrode 8 varies. The impedance varies with frequency corresponding to the cycle of the capacity variation, whereby it is possible to select a signal with the frequency. Resonator 5 and electrode 9 are the same as the foregoing in behavior.

At this point, when the alternating electric fields input to electrodes 8 and 9 are in phase, as shown in FIG. 9, resonators 4 and 5 oscillate in twisting direction.

When the alternating electric fields input to electrodes 8 and 9 are in opposite phase, since forces acting between resonator 4 and electrode 8 and between resonator 5 and electrode 9 are attraction or repulsion, as shown in FIG. 8, resonators 4 and 5 tend to oscillate in vertical mode. By designing shapes of resonators 4 and 5 and electrodes 8 and 9, and distances between resonator 4 and electrode 8 and between resonator 5 and electrode 9 such that a resonance frequency of each mode becomes a desired value to control modes of vibration, it is possible to vary the resonance frequency of the filter readily.

In the above description, alternating signals are applied to electrodes 8 and 9 to cause resonators 4 and 5 to oscillate, whereby with respect to signals passed through resonators 4 and 5, generated are signals with a frequency being passed through and signals with a frequency being not passed through and thus the device serves as a filter. However, as a method of causing resonators 4 and 5 to oscillate, other methods are applicable.

In other words, it is not always required to apply an alternating electric field from the outside, and resonators 4 and 5 may be driven by the electrostatic force that high-frequency signals input to the resonators have.

Some configurations are considered as the filtering operation in such cases. For example, controls signals 11 and 12 in FIG. 1 may be replaced with loads to implement the filtering. Some figures show schematic configurations of the embodiment. (For example,) when a control signal is not input from the outside, resonators 4 and 5 are driven by the electrostatic force that signals passed through resonators 4 and 5 have.

When the signals passed through resonators 4 and 5 contain signals with a natural frequency obtained when resonators 4 and 5 are coupled, resonators 4 and 5 oscillate greatly. At this point, for example, when the oscillation mode is set at a vertical oscillation mode, resonators 4 and 5 greatly oscillate vertically to the substrate, and a gap between resonators 4 and 5 and electrodes 8 and 9 varies, resulting in electrical coupling.

That is, since resonators 4 and 5 oscillate with the natural frequency, signals with the natural frequency are selectively coupled to electrodes 8 and 9, and are not conveyed to input/output ports, thus having so-called notch filter effect. In this state, when electrodes 8 and 9 are connected to terminals and the natural frequency of resonators 4 and 5 is designed to a desired value, the device can be used as a duplexer.

Further, in inputting signals from the outside, control signal 11 or control signal 12 is input to oscillate resonators 4 and 5. The signal with the natural frequency causes resonators 4 and 5 to oscillate strongly, and is capable of selectively canceling only the signal with the frequency used in oscillation.

Furthermore, the control signal is not always required to have the natural frequency, and only required to have the electrostatic force capable of oscillating resonators 4 and 5.

For example, when electrodes 8 and 9 are not given control signals as their inputs and output terminals are connected, signals input from input terminals oscillate resonators 4 and 5, and only signals with frequencies around the natural frequency are selectively output from the output terminals.

When a single resonator is assumed, since the Q-value of the resonator is high, the resonance frequency is steep, and it is not possible to selectively fetch signals except only the signal with the natural frequency. However, in the micro device of the present invention, since two same resonators are coupled to oscillate, it is possible to cause oscillations separately in two modes between which is the natural frequency of a single resonator. In other words, two modes occur where two resonators oscillate in the same direction or in opposite phase, and the device operates as a filter with a band of Δf.

Figure 10:
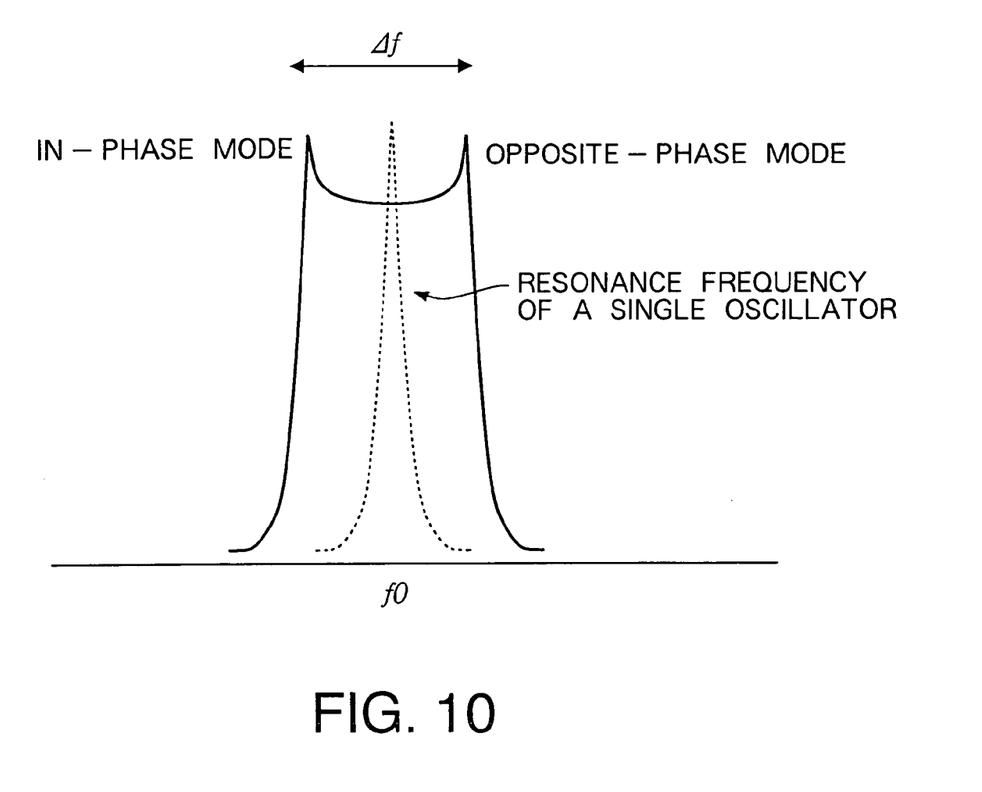
FIG. 10 is a diagram illustrating an example of frequency characteristics of the micro device according to the above embodiment.

FIG. 10 is a diagram illustrating an example of frequency characteristics of the micro device in this embodiment. In FIG. 10 the spectrum shown by dotted line indicates the natural frequency of a single resonator. In FIG. 10 the spectrum shown by solid line indicates one obtained by coupled two resonators. A desired band varies depending on the applied system in order to apply the device to a filter, varying the degree of coupling of resonators varies the band.

Since coupled resonators 4 and 5 are considered to form a doubly-supported-beam structure, the natural frequency is indicated with equation (1):

$$f = 1.03 \frac{t}{L^2} \sqrt{\frac{E}{\rho}} \tag{1}$$

where, t is a thickness of the beam, L is a length of the beam, E is the Young's modulus of a material composing the beam, and ρ indicates a density. In order to obtain a desired frequency, controlling a shape of a beam is capable of setting a desired frequency.

Thus, the micro device of this embodiment is capable of operating as a device with two functions, i.e., as a switch by using oscillation in horizontal direction as in the first embodiment and as a filter easily capable of canceling or selecting signals with a desired frequency by using oscillation in vertical direction.

Figure 11:
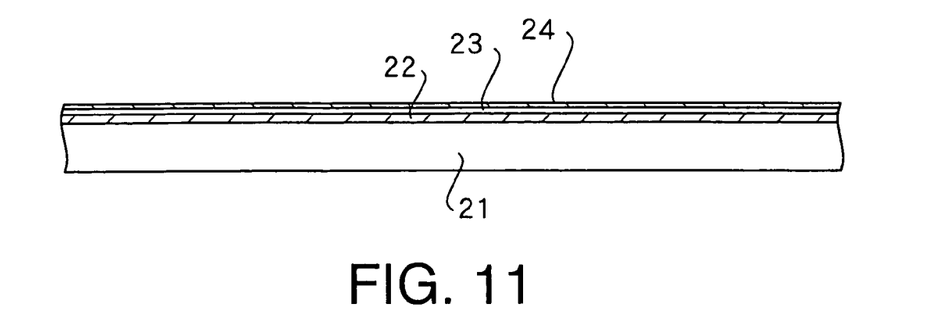
FIG. 11 is a cross-sectional view in processes for manufacturing the micro device according to the above embodiment.

Examples of processes of forming the above-mentioned switch will be described below. FIGS. 11 to 16 are cross-sectional views in processes for manufacturing the micro device according to this embodiment. As illustrated in FIG. 11, by subjecting high-resistance silicon substrate 21 to thermal oxidation, silicon oxide film 22 with a thickness of about 300 nm is formed on high-resistance silicon substrate 21. Then, silicon nitride film 23 is deposited with a thickness of 20 nm using a pressure reducing CDV method. Further, silicon oxide film 24 with a thickness of 50 nm is deposited using the pressure reducing CDV method.

Figure 12:
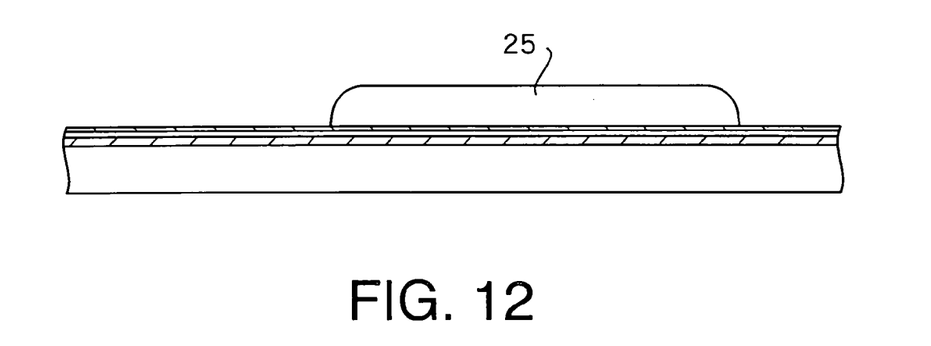
FIG. 12 is another cross-sectional view in processes for manufacturing the micro device according to the above embodiment.

Subsequently, as shown in FIG. 12, a sacrifice layer with a thickness of 2 µm composed of a photoresist coating is spin-coated, exposed and developed on silicon oxide film 24, and baked at 140° C. for ten minutes with a hotplate to form sacrifice layer 25.

Figure 13:
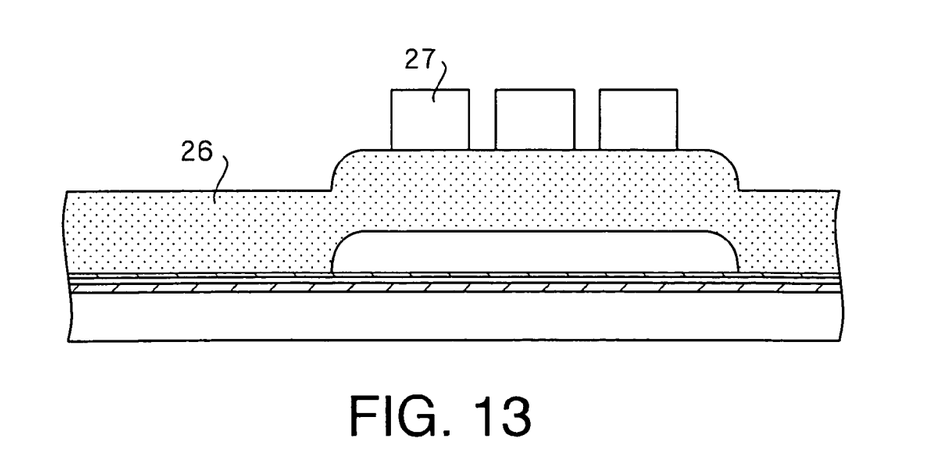
FIG. 13 is another cross-sectional view in processes for manufacturing the micro device according to the above embodiment.

Then, as shown in FIG. 13, Al 26 is deposited with a thickness of 2 µm on the entire surface of the substrate, and patterns 27 are formed by photoresist coating such that the resist is left in a predetermined area.

Figure 14:
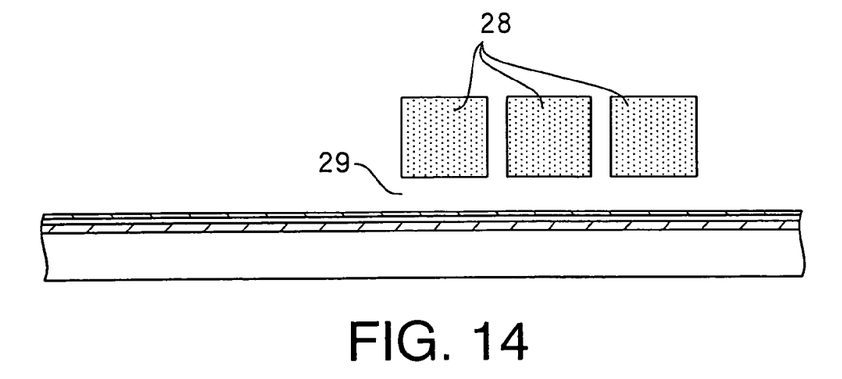
FIG. 14 is another cross-sectional view in processes for manufacturing the micro device according to the above embodiment.

Next, as shown in FIG. 14, the dry etching with Al is performed using the patterns composed of the photoresist coating as masks, thereby forming beams 28, and then patterns 27 and sacrifice layer 25 composed of photoresist coating are removed with $O_2$ plasma. The aforementioned processes form beams 28 with gap 29 with the surface of the substrate.

Figure 15:
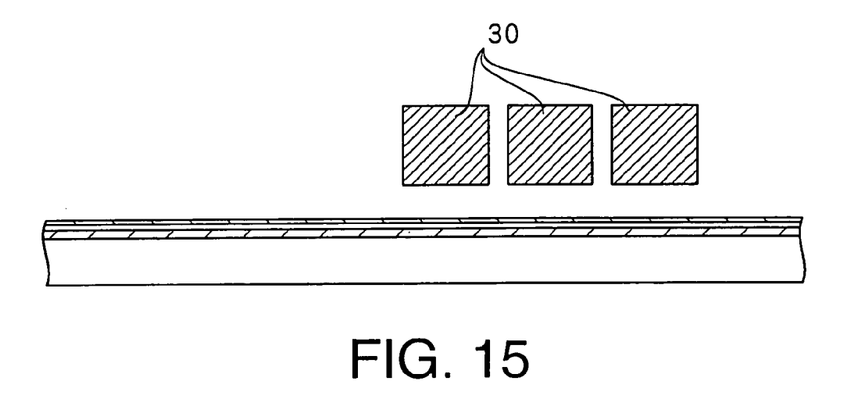
FIG. 15 is another cross-sectional view in processes for manufacturing the micro device according to the above embodiment.

Further, as shown in FIG. 15, silicon nitride film 30 with a thickness of 50 nm is deposited over the entire surface by plasma CDV, whereby the silicon nitride film is formed on silicon oxide film 24 and around beams 28 on the surface of the substrate.

Figure 16:
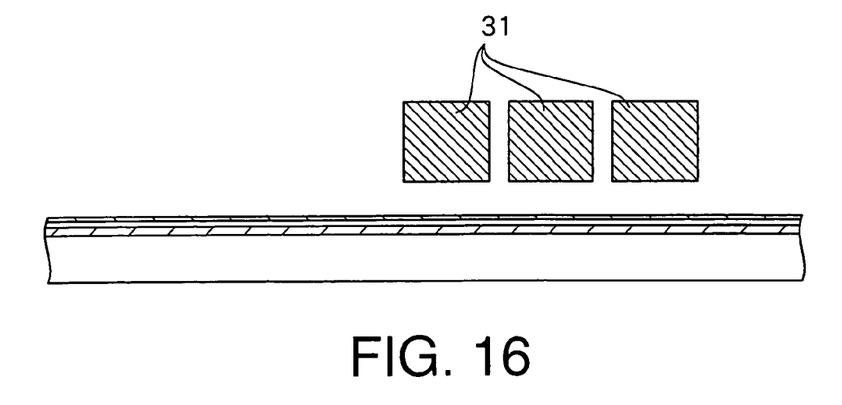
FIG. 16 is another cross-sectional view in processes for manufacturing the micro device according to the above embodiment.

Finally, as shown in FIG. 16, etchback is performed on the silicon nitride film under condition providing a selective ratio to the silicon oxide film, for example, with a thickness of 100 nm or more that is more than the deposit film thickness using the dry etching method with anisotropy, whereby the etching is performed so that the beam has no silicon nitride film on its upper surface with the silicon nitride film left on its side surface 31.

In addition, while in this embodiment a high-resistance silicon substrate is used, either an insulator or semiconductor is applicable. For example, general silicon substrates, chemical semiconductors and insulating substrates are applicable.

Further, while silicon oxide film 22, silicon nitride film 23 and silicon oxide film 24 are formed on high-resistance silicon substrate 21 as insulating films, formation of the insulating films may be omitted when the resistance of the substrate is adequately high. Furthermore, a three-layer insulating film, i.e., silicon oxide film 22, silicon nitride film 23 and silicon oxide film 24, is formed on the silicon substrate. However, when the thickness of silicon nitride film 23 is thicker enough than that of the silicon nitride film deposited on the beam, i.e., when the thickness is not removed even after so-called etchback process, the process of forming silicon oxide film 24 can be omitted.

In addition, while this embodiment uses Al as a material for forming the beam, it may be possible to use other metal materials such as Mo, Ti, Au and Cu, semiconductor materials with high-concentration impurities contained therein such as, for example, amorphous silicon and conductive polymer materials. Further, while sputtering is used as a film formation method, other methods such as CVD and plating may be used.

(Second Embodiment)

Figure 17:
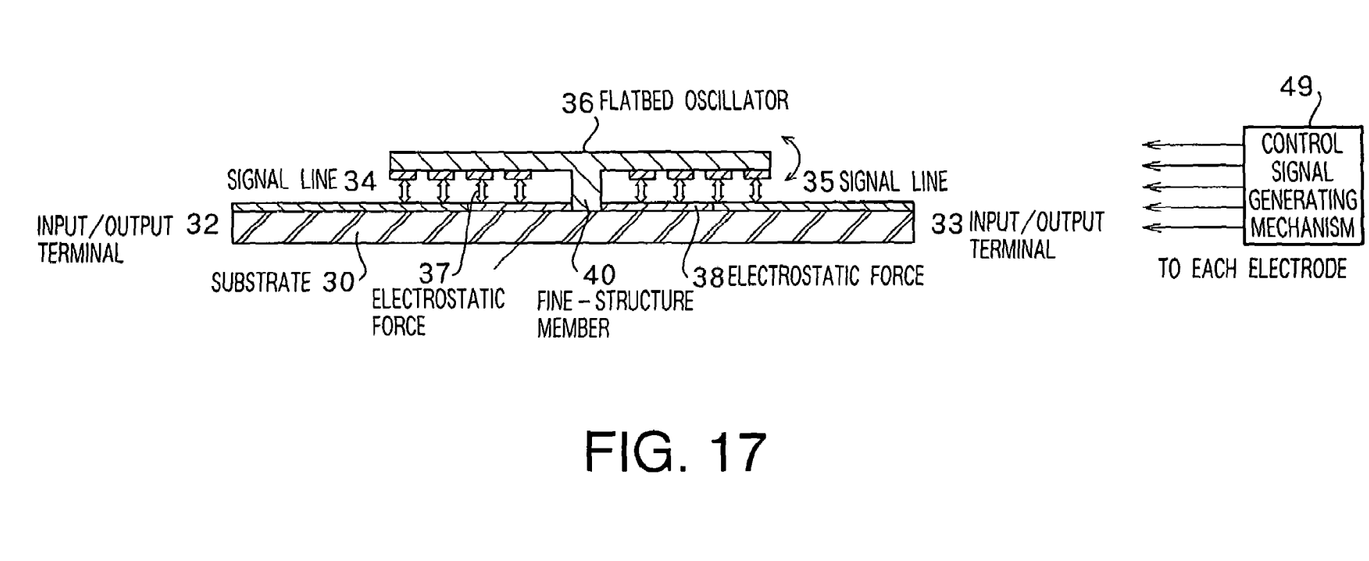
FIG. 17 is a diagram illustrating a schematic configuration of a switch according to a second embodiment of the present invention.
Figure 18:
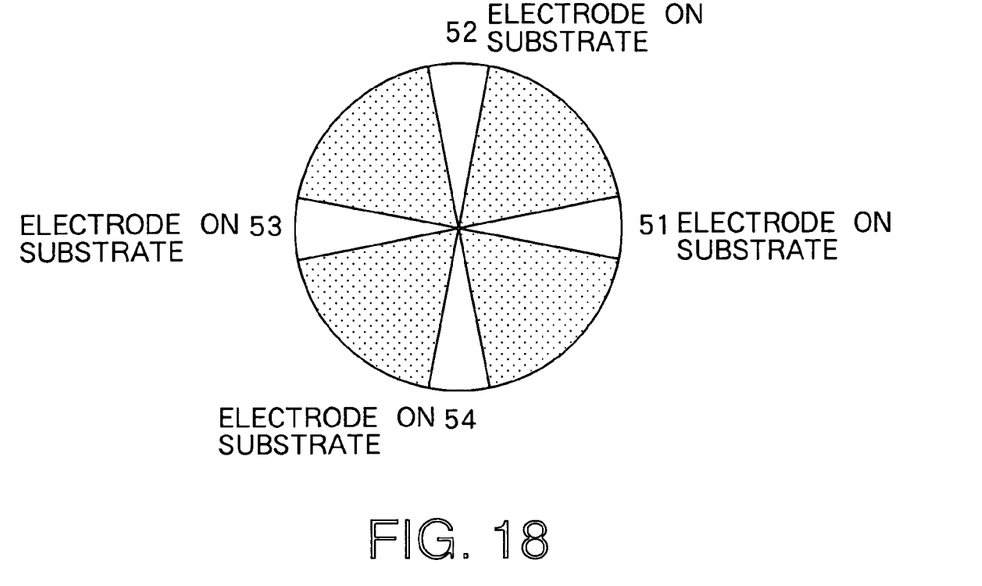
FIG. 18 is a diagram illustrating an electrode pattern on a substrate of the switch according to the above embodiment.
Figure 19:
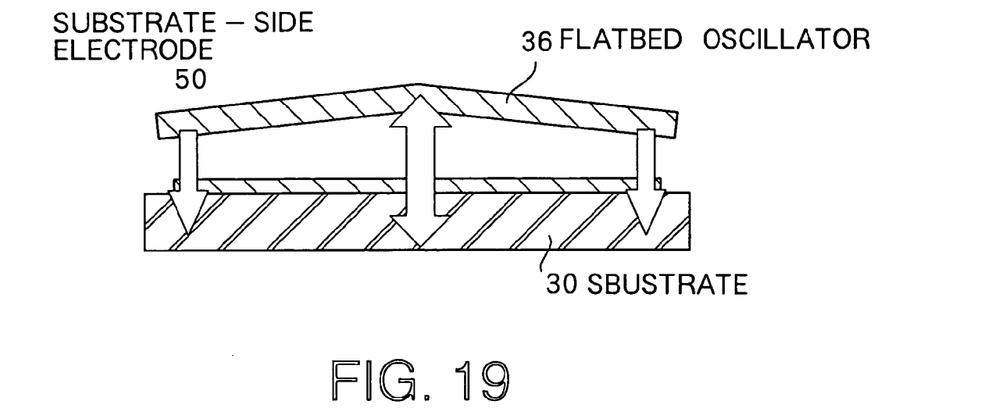
FIG. 19 is a diagram illustrating a cross section of the switch according to the above embodiment.

The second embodiment of the present invention will be described with reference to FIGS. 17 to 19. FIG. 17 is a diagram illustrating a schematic configuration of a micro device of the second embodiment of the present invention. A signal input from input/output terminal 33 is electrically coupled to flatbed resonator 36 through signal line 35, flatbed resonator 36 is further electrically coupled to signal line 34, and thereby the signal is output from input/output terminal 32. Thus coupled signal is selectively coupled to a signal with the frequency with which flatbed resonator 36 oscillates, and thereby the device serves as a filter.

The specific contents will be described below. A plurality of electrodes 50 is provided on a substrate side of flatbed resonator 36, a plurality of electrodes 30 is provided on the substrate, and it is possible to apply a voltage independently to each electrode with a control signal generated from control signal generating mechanism 49, thereby enabling arbitrary electrostatic force to be generated between flatbed resonator 36 and substrate 30. Therefore, it is possible to apply the electrostatic force to flatbed resonator 36 in the arbitrary direction by arbitrary force. By varying the frequency, amplitude and position of thus applied control signal, it is possible to control the oscillation frequency and oscillation mode of the flatbed resonator.

For example, electrode 38 is assumed to be comprised of fan-shaped electrodes 51 to 54. When direct voltage −Vc is uniformly applied to all the flatbed resonator electrodes 50 and the control signal indicated by −Vc×Sin(fbt) is applied to all the electrodes (51 to 54) on the substrate, the flatbed resonator is forced to oscillate with a frequency corresponding to frequency fb of the control signal. Further, when a control signal is applied to part of the electrodes in impulse, the flatbed resonator is driven and oscillates with the natural frequency. The natural frequency is indicated with equation (2), where m and k respectively indicate mass and spring constant:

$$fc = \frac{1}{2\pi}\sqrt{\frac{k_1}{m}} \qquad (2)$$

With direct voltage −V1 uniformly applied to electrodes 50 of the flatbed resonator and with direct voltage +V2 applied to electrodes 51 and 53 on the substrate, a control signal indicated by −V1×Sin(fct) is applied to electrodes 52 and 54 on the substrate to oscillate the flatbed resonator. At this point, as shown in FIG. 19, flatbed resonator 36 bends due to the electrostatic force applied from electrodes 51 and 53, and thereby the spring constant of the flatbed resonator varies. Therefore, according to equation (1), it is possible to vary the natural frequency of the flatbed resonator. Since it is thus possible to arbitrarily control the frequency and mode with which the flatbed resonator oscillates, it is possible to vary the center frequency of passage band of the filter.

(Third Embodiment)

Figure 20:
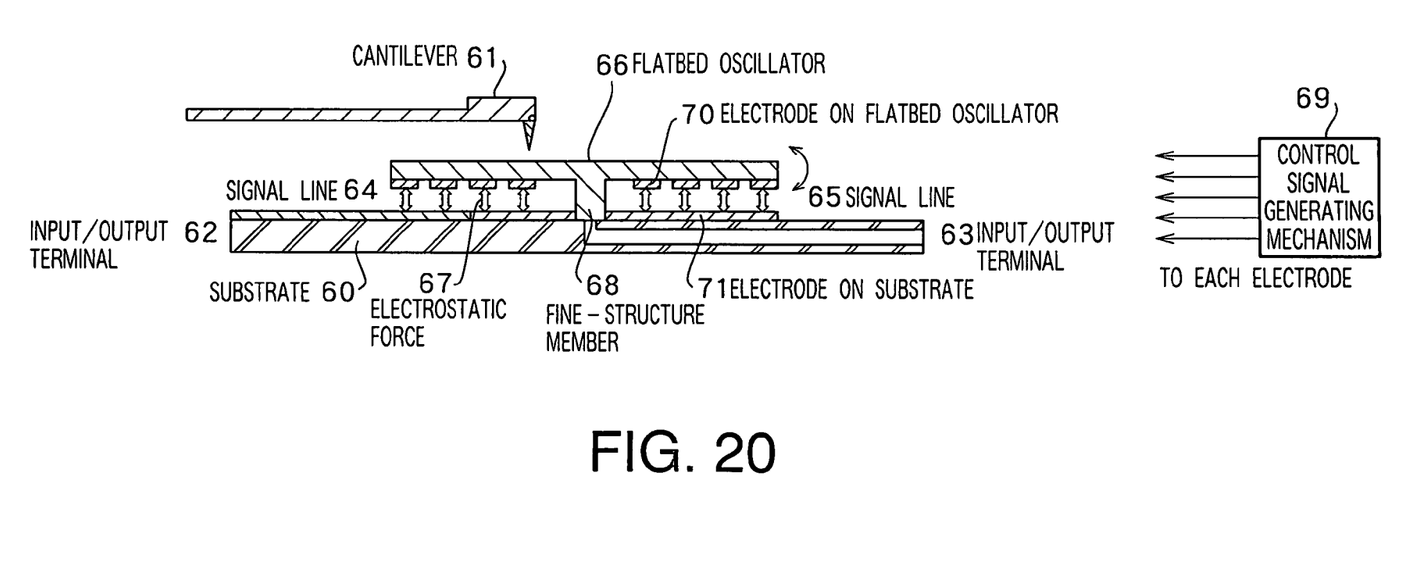
FIG. 20 is a diagram illustrating a schematic configuration of a switch according to a third embodiment of the present invention.
Figure 21:
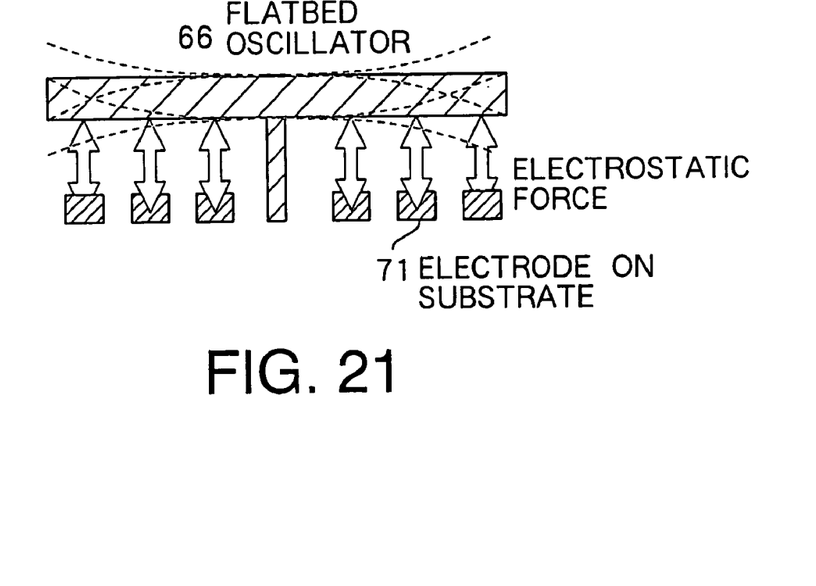
FIG. 21 is a diagram illustrating an occurrence of a fixed end with a cantilever in the switch according to the above embodiment.
Figure 22:
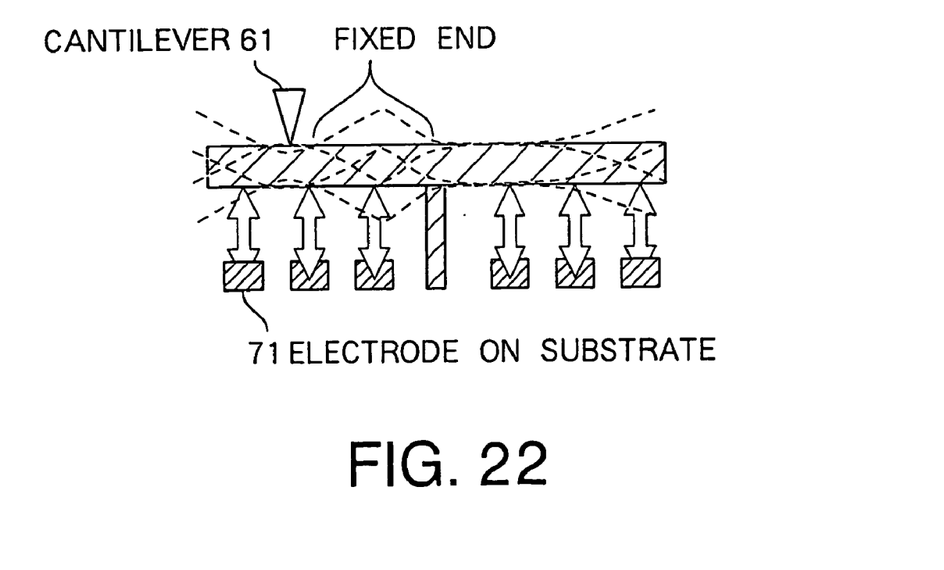
FIG. 22 is a diagram illustrating operation of the switch according to the above embodiment.

The third embodiment of the present invention will be described with reference to FIGS. 20 to 22. FIG. 20 illustrates a schematic configuration of the third embodiment of the present invention, which is similar to the second embodiment except cantilever 61 provided on flatbed resonator 66. Cantilever 61 has three-axis control mechanism (not shown) movable in the horizontal direction and vertical direction to come into contact with flatbed resonator 66 in arbitrary position. In the second embodiment, in order to control the mode and resonance frequency with which the flatbed resonator oscillates, the electrostatic force is applied from the outside to control the mode and frequency to desired ones. In this embodiment, cantilever 66 is physically brought into contact with the resonator and thereby a fixed end is provided in the resonator arbitrarily, thereby controlling the oscillation mode and resonance frequency of the flatbed resonator. FIGS. 21 and 22 illustrate an example. As shown in FIG. 21, when the cantilever is not in contact, flatbed resonator 71 oscillates with the basic mode (with the resonance frequency of f0). On the contrary, as shown in FIG. 22, when the resonator is forcibly fixed by cantilever 61, the flatbed resonator is divided into some resonators and oscillates with a plurality of frequencies (resonance frequencies f0, f1 and f2).

Further, an input signal input from signal line 65 may be directly input to resonator 66 as shown in FIG. 22. In this case, since the oscillation frequency varies with the position in which the signal line is fetched, it is possible to fetch signals with a plurality of frequencies.

As can be apparent from the foregoing, according to the micro device of the present invention, by bringing into contact with or separating independently a plurality of resonators for feeding or interrupting electric signals with static electricity, it is possible to obtain a distance twice that corresponding to the applied voltage and to secure higher isolation with a low voltage.

Further, according to the micro device of the present invention, since it is possible to arbitrarily vary the oscillation mode and frequency with which the resonator oscillates, it is possible to arbitrarily set the power and frequency of a signal passed through the device.

This application is based on the Japanese Patent Applications No.2002-006908 filed on Jan. 16, 2002, and NO.2002-364322 filed on Dec. 16, 2002, and entire contents of which are expressly incorporated by reference herein.

INDUSTRIAL APPLICABILITY

The present invention is suitable for use in micro devices used in electric circuitry

The invention claimed is:

1. A micro device, comprising:
a plurality of fine-structure resonators; and
a plurality of electrodes, wherein
a voltage is applied to at least one of the plurality of electrodes causing the at least one electrode to exert an electrostatic force on at least one of the plurality of resonators,
a signal is transmitted through the at least one resonator when the at least one resonator is caused to contact at least one other of the plurality of resonators, the signal being interrupted when the at least one resonator is caused to separate from the at least one other resonator,
a direct current source is input to at least one of the plurality of resonators; and an alternating current source is input to at least one of the plurality of electrodes, and wherein
an impedance is matched with a characteristic impedance corresponding to a frequency of an input signal when the plurality of resonators and at least one electrode are caused to contact each other.

2. The micro device of claim 1, further comprising:
a sealer that vacuum-seals the plurality of resonators.

3. A micro device, comprising:
a plurality of fine-structure resonators;
a plurality of first electrodes; and
at least one second electrode, wherein
a voltage is applied to the plurality of first electrodes, the at least one second electrode is caused to exert an electrostatic force on at least one of the plurality of resonators to cause the at least one resonator to oscillate and to cause the capacitance between the plurality of resonators to vary, and
a signal is transmitted through the at least one resonator when the at least one resonator is caused to contact at least one other of the plurality of resonators, the signal being interrupted when the at least one resonator is caused to separate from the at least one other resonator.

4. The micro device of claim 3, further comprising:
a signal being provided to the at least one second electrode to cause the electrode to exert the electrostatic force.

5. The micro device of claim 3, further comprising a signal being applied to the at least one second electrode to exert an electrostatic force on the at least one of the plurality of resonators, causing the at least one resonator to oscillate.

6. A micro device, comprising:
a plurality of fine-structure resonators;
a plurality of first electrodes, wherein a voltage is applied to at least one of the plurality of first electrodes; and
a plurality of second electrodes, wherein
at least one of the plurality of second electrodes exerts an electrostatic force on at least one of the plurality of resonators in a predetermined direction that is perpendicular to a direction of an electrostatic force exerted by at least one of the plurality of first electrodes on the at least one resonator,
an alternating current signal is applied to the at least one second electrode, wherein a plurality of alternating current signals comprising different frequencies for each of the plurality of second electrodes are supplied, and
wherein signals are transmitted through the at least one resonator when the at least one resonator is caused to contact at least one other of the plurality of resonators, and the signals are interrupted when the at least one resonator is caused to separate from the at least on other resonator.

\* \* \* \* \*